United States Patent

Kleinert, III et al.

Patent Number: 5,250,371
Date of Patent: Oct. 5, 1993

[54] WELDLESS SURFACE MOUNTED INTERCONNECT

[75] Inventors: Raymond J. Kleinert, III, Ft. Lauderdale; John H. Hackenberg, Plantation; Russell E. Gyenes, Sunrise; Willard F. Amero, Jr., Davie, all of Fla.

[73] Assignee: Motorola, Inc., Schaumburg, Ill.

[21] Appl. No.: 812,925

[22] Filed: Dec. 24, 1991

[51] Int. Cl.$^5$ ............................................. H01M 2/10
[52] U.S. Cl. ...................................... 429/99; 455/343
[58] Field of Search ................... 429/99, 100; 455/343

[56] References Cited

U.S. PATENT DOCUMENTS

| | | |
|---|---|---|
| 4,213,078 | 7/1980 | Ferrell et al. .................. 429/100 X |
| 4,414,298 | 11/1983 | Krenz ............................. 429/99 |
| 4,871,628 | 10/1989 | Parker ......................... 429/99 X |
| 5,017,443 | 5/1991 | Tominaga ....................... 429/99 |
| 5,096,788 | 3/1992 | Bresin et al. ................... 429/99 |
| 5,104,754 | 4/1992 | Dorinski et al. ................ 429/99 |
| 5,116,699 | 5/1992 | Miyajima ...................... 429/100 |

*Primary Examiner*—Stephen Kalafut
*Attorney, Agent, or Firm*—Lesley A. Rhyne

[57] ABSTRACT

A weldless battery pack (10) comprises a housing (14) having a flexible circuit (16) inserted within the housing. The flexible circuit has at least one spring contact (20) integrally formed on the flexible circuit. Inside the housing is a plurality of cells (12) interconnected by at least one of the spring contacts (20) formed on the flexible circuit.

13 Claims, 5 Drawing Sheets

WELDLESS SURFACE MOUNTED INTERCONNECT

TECHNICAL FIELD

This invention relates generally to battery interconnects and, more particularly, to a battery interconnect on a flexible circuit substrate.

BACKGROUND

In portable electronics and particularly communication products, the need for a constant power source is critical. Furthermore, the need for easily assembled and disassembled battery packs such as weldless battery packs are just as critical. Therefore, a weldless battery pack with no intermittency problem would be a boon to the portable communication industry.

Traditionally, battery packs have a number of cells that are coupled together using spot welding. Spot welding creates leakage problems. Spot welding contacts is labor intensive and does not provide for ease of assembly or disassembly of the battery pack. Therefore, a need exists for a weldless battery pack that is not susceptible to intermittency.

Battery packs for portable electronic products are typically subjected to a repeated number of drops. In particular, users of portable communication products such as two-way radios, cordless telephones, and cellular phones tend to drop their portable products, causing the problem of intercell contact intermittency. This temporary loss of power due to a broken connection causes unpredictable device operation, or in the case of a device with volatile memory circuits, a total loss of the memory's contents. This problem could potentially cause the loss of communications and/or other functions in other portable electronic products as well.

A battery can comprise of a single battery cell or a plurality of battery cells arranged in a stick fashion, or end-to-end, for example. A contacting scheme is required to reliably connect the battery cells between themselves and with the external electronic circuitry in the electronic device during all modes of operation. Battery cells are often cylindrically or rectangularly shaped and include positive and negative electrical contact surfaces at their opposed ends respectively. Consequently, the battery cells are coupled together to form batteries generally located in a cylindrical chamber or a rectangular chamber formed within a battery housing. To contact a battery, present embodiments require that conductive contacts be placed at opposite ends of the cylindrical or rectangular chamber so as to electrically and mechanically contact the respective positive and negative battery terminal surfaces of the battery situated in the chamber. Using conventional spring contacting methods, a conductive spring that compresses when the battery is inserted is situated at one end of the chamber. The spring force exerted by the contact acts to retain the battery against an opposing contact which is typically located on the opposite end of the battery.

For the production of battery packs where the cells are placed end-to-end, intercell connections such as welds are often used between cells to prevent the plurality of battery cells from being permanently dislocated or displaced due to a vibration or a drop of the electronic device. The intercell connections are necessary since typically the contact spring force of the spring contact at the end of the cell string is not high enough to overcome the internal rattle of the cells during vibration or a drop.

The need to eliminate the problem of intercell contact intermittency is even greater today, since the trend in manufacturing of battery packs is toward a weldless battery design. In addition, manufacturing cycle time would be reduced with the eliminated step to spot weld battery cells together in a battery pack since welding is an inefficient manufacturing step. However, intercell contacts still continue to be welded due to the unreliability of weldless batteries. Thus, the trend towards weldless battery packs will move forward as the risk of intercell contact intermittency diminishes. Therefore, a need exists for a battery pack, particularly a weldless battery, that will endure repeated drop conditions and eliminate the problem of intercell contact intermittency.

SUMMARY OF THE INVENTION

A weldless battery pack comprises a housing having a flexible circuit inserted within the housing. The flexible circuit has at least one spring contact integrally formed on the flexible circuit Inside the housing are a plurality of cells interconnected by at least one of the spring contacts formed on the flexible circuit.

DETAILED DESCRIPTION OF THE PREFERRED EMBODIMENT

Figure 1:
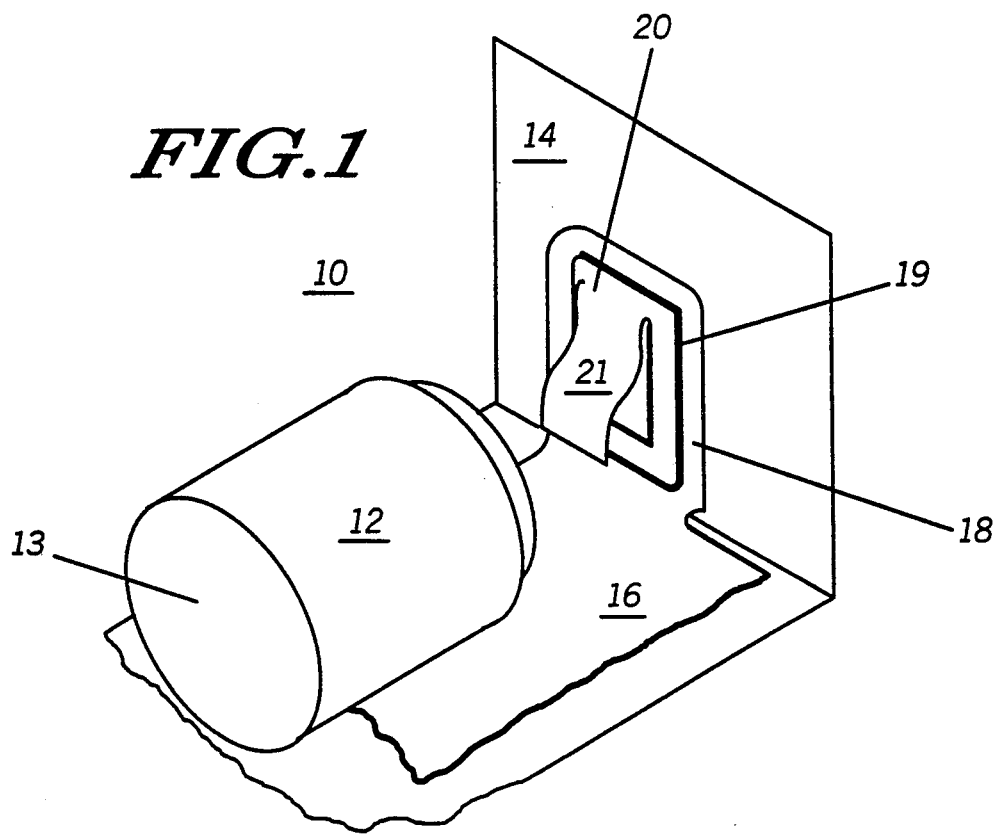
FIG. 1 is a partial perspective view of a weldless surface mounted battery pack interconnect in accordance with the present invention.

Referring to FIG. 1, there is shown partial perspective view of a weldless battery pack 10 comprising a housing 14 having a flexible circuit 16 inserted within the housing. Integrally formed on a living hinge portion 18 of the flexible circuit 16 is a spring contact 20 used to bias a battery 12 into a snug fit within the housing 14. The spring contact 20 also aides in preventing intermittency within the battery pack. The spring contact 20, shown in FIG. 1 as a substantially L shaped metallic bracket, preferably includes a leaf spring member 21. The spring contact 20 is also preferably soldered (19) to the living hinge portion which would have some metalization on the area where solder would interconnect the flexible circuit with the contact. Thus, the protruding portion 11 of a battery terminal would couple with the leaf spring member 21 and a flat terminal portion 13 of the battery 12 would couple with either another battery terminal or another leaf spring contact.

Figure 2:
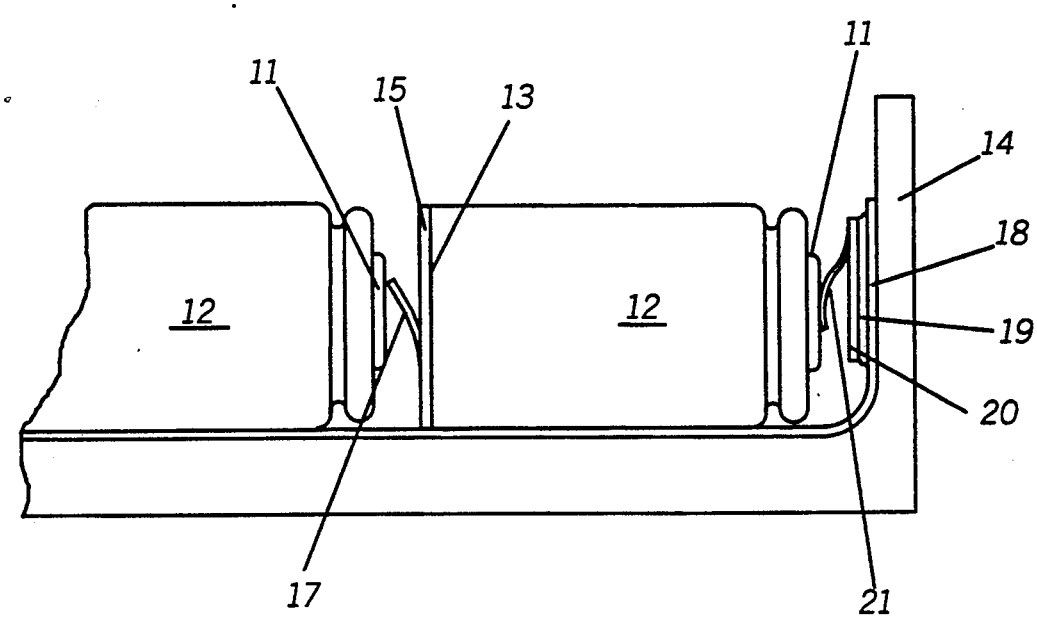
FIG. 2 is a partial side view of a weldless surface mounted battery pack interconnect and intercell spring in accordance with the present invention.
Figure 8:
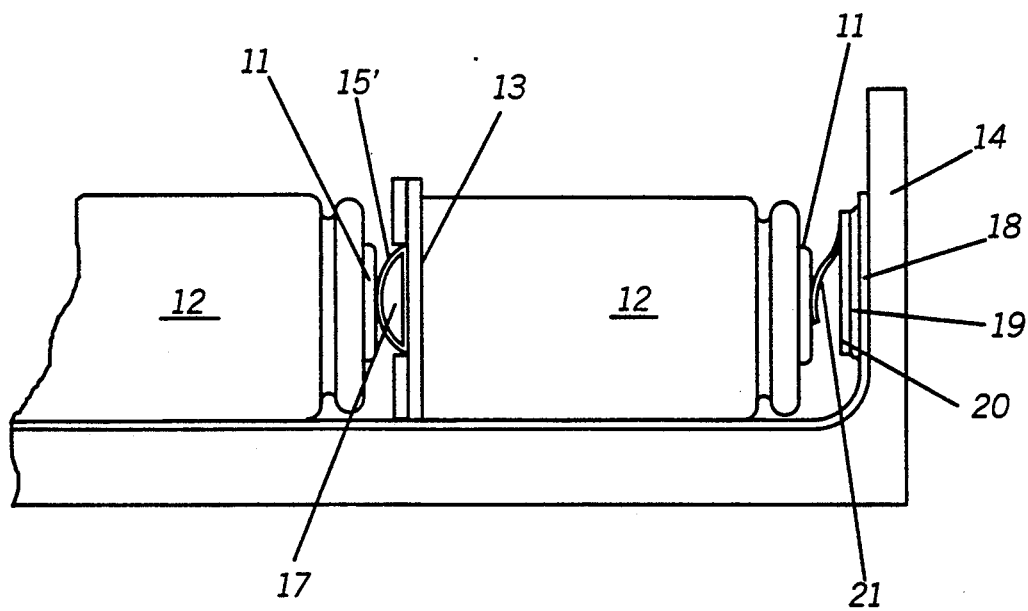
FIG. 8 is a partial side view of a weldless surface mounted battery pack interconnect and intercell spring in accordance with an alternative embodiment of the invention.

Referring to FIG. 2, there is shown a side view of the weldless battery pack 10 of FIG. 1 further including a second battery. The protruding terminal 11 of the second battery is coupled to the flat portion 13 of the first battery via an intercell contact 15 which also has a leaf spring member 17. The intercell contact or wedge 15 not only provide contact between the two cells, but also further aides in the prevention of intermittency. If battery pack 10 is dropped or subjected to shock, the batteries would remain connected due to the pliancy of the contacts 20 and 15. Wedge 15 is a spring means that can be realized as a disc shaped wedge spring as shown in FIG. 2, a popple contact 15' as shown in FIG. 8, or a L-shaped bracket as shown in FIG. 1 as a spring contact 20.

Figure 3:
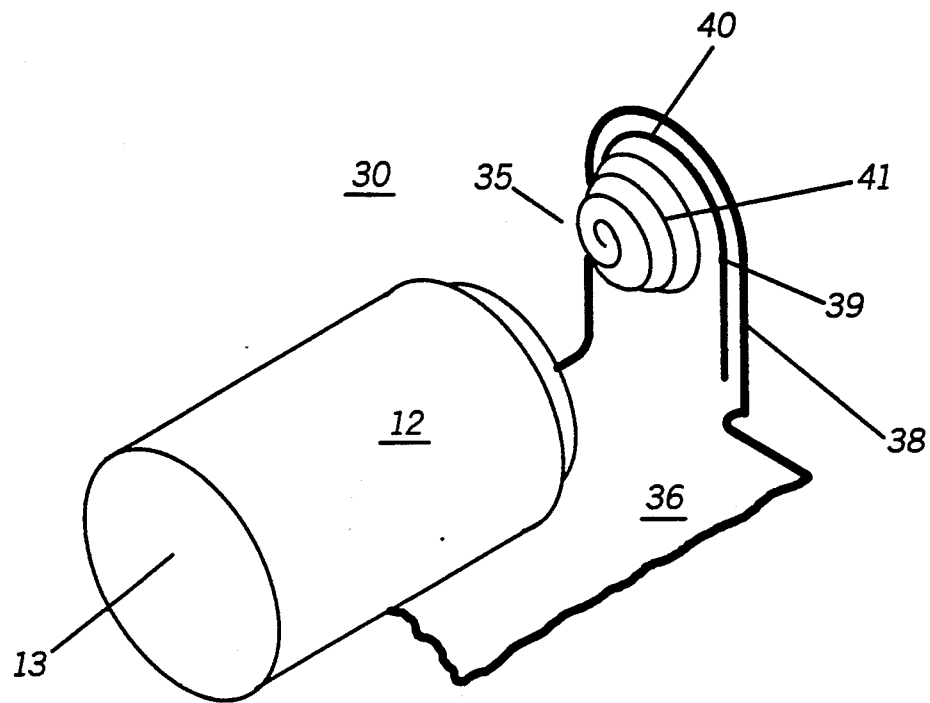
FIG. 3 is another partial perspective view of a weldless surface mounted battery pack interconnect in accordance with the present invention.
Figure 4:
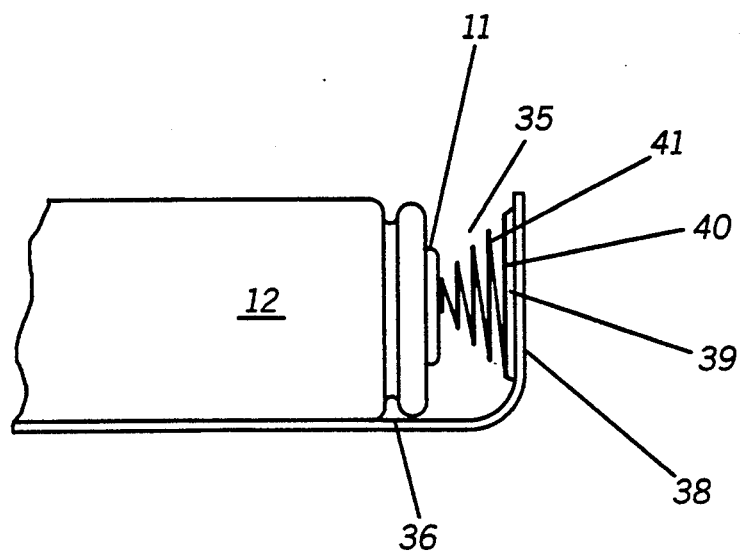
FIG. 4 is a partial side view of a weldless surface mounted battery pack interconnect in accordance with the present invention.

Referring to FIGS. 3 and 4, there is shown a partial perspective view and a side view respectively of another weldless battery pack 30 similar to battery pack 10. The battery pack 30 comprises a housing (not shown) having a flexible circuit 36 within the housing. Again, a living hinge portion 38 of the flexible circuit 36 is integrally formed on the flexible circuit 36 to allow the attachment of a coiled spring 35 thereon. The coiled spring 35 preferably has a soldered down portion 40 and a loose portion 41. Solder 39 is used to retain the soldered down portion 40 of the coil spring 35 to the living hinge portion 38 of the flexible circuit 36.

Figure 5:
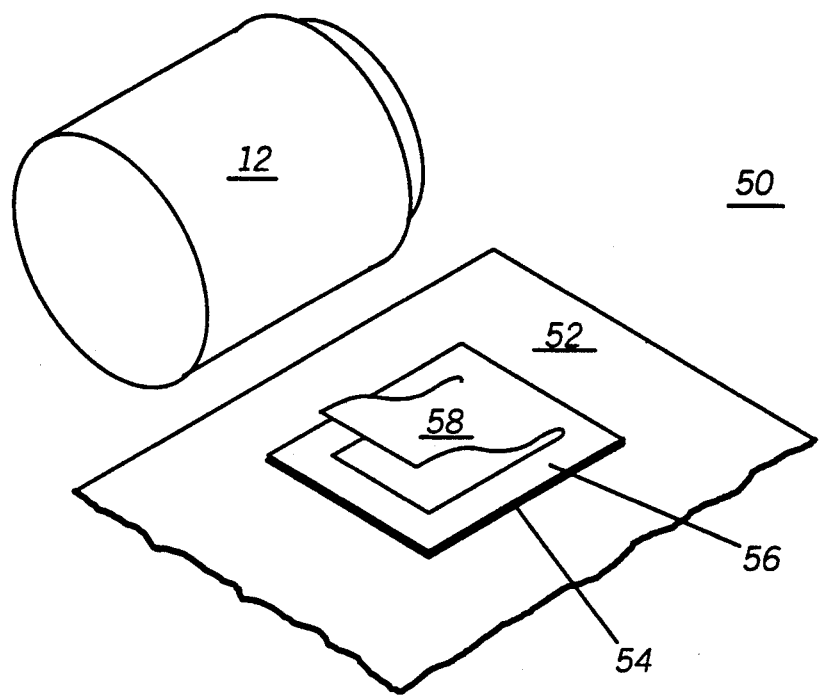
FIG. 5 is another partial perspective view of a weldless surface mounted battery pack interconnect in accordance with the present invention.
Figure 6:
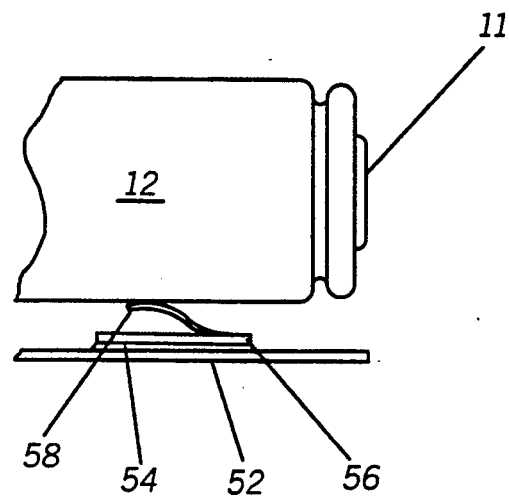
FIG. 6 is another partial side view of a weldless surface mounted battery pack interconnect in accordance with the present invention.

Referring to FIGS. 5 and 6, there is shown a partial perspective view and a side view respectively of another weldless battery pack 50. The battery pack 50 comprises a housing (not shown) having a substrate 52 within the housing. A spring contact 56 having a leaf spring member 58 is preferably soldered (54) to metalized portions (not shown) of the substrate. The can of a battery 12 is then placed on top of the leaf spring portion 58. The can of a battery typically provides a grounding contact or negative contact. Furthermore, the leaf spring biases the battery vertically towards a wall (not shown) of the housing, thereby reducing the chances of intermittency due to vertical movement of the cell. Of course the spring contacts on the flexible circuits of FIGS. 1-4 could be used in any combination with the spring contact of FIGS. 5 and 6.

Figure 7:
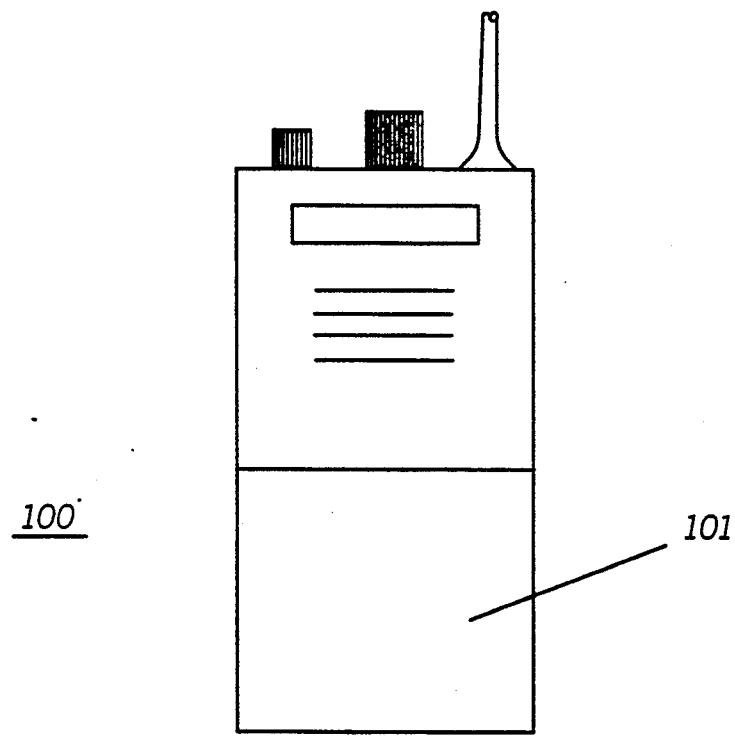
FIG. 7 is a radio having a rechargeable battery in accordance with the present invention.

Finally, FIG. 7 shows a radio 100 having a battery pack 101 in accordance with the present invention. The battery pack 101 is preferably detachable from the radio 100 and also rechargeable. The batteries of FIGS. 1-6 are suitable for portable electronic equipment requiring a constant power source such as cellular phones, two-way radios, and other devices using volatile memory.

What is claimed is:

1. A weldless battery pack, comprising:
   a housing;
   an independent flexible circuit inserted into said housing;
   at least one spring contact integrally formed on the flexible circuit; and
   a plurality of cells within said housing so that at least two cells include a first end and a second end wherein the first end of one cell is connected to the second end of an adjacent cell by a spring means for reducing intermittency between said cells and said flexible circuit.

2. The weldless battery pack of claim 1, wherein said spring means comprises a popple contact having a flat portion coupled to the negative terminal of a cell and a domed portion coupled to the positive terminal of an adjacent cell.

3. The weldless battery pack of claim 1, wherein said spring means comprises a disc-shaped wedge spring having a cantilever member protruding from the base for placement between at least some of said plurality of cells.

4. The weldless battery pack of claim 1, wherein said at least one spring contact integrally formed on the flexible circuit is soldered to the flexible circuit.

5. A spring loaded battery assembly for reducing battery intercell-contact intermittency, comprising:
   a cell having a negative terminal and a positive terminal, said negative terminal being coupled to a cell can;
   a flexible circuit for retaining and coupling said cell;
   a spring contact integrally formed in on said flexible circuit and coupled to said cell for biasing said negative terminal towards a positive terminal of another cell.
   a plurality of cells within said housing so that at least two cells include a first end and a second end wherein the first end of one cell is connected to the second end of an adjacent cell by a spring means for reducing intermittency between said cells and said flexible circuit.

6. The spring loaded battery assembly of claim 5, wherein said spring means comprises a popple contact having a flat portion coupled to the negative terminal of said cell and a domed portion coupled to the positive terminal of an adjacent cell.

7. The spring loaded battery assembly of claim 5, wherein said spring means comprises a substantially L shaped metallic bracket having a first leaf spring on a horizontal member biased towards said cell can, a second leaf spring on a vertical member biased for coupling said negative terminal on said cell to a positive terminal on an adjacent cell, and a means for entrenching said bracket into said flexible circuit.

8. The spring loaded battery assembly of claim 5, wherein the spring means comprises a disc-shaped wedge spring having a cantilever member protruding from the base for placement between at least some of said plurality of cells.

9. The spring loaded battery assembly of claim 5, wherein said spring contact is soldered to the flexible circuit.

10. A radio assembly having a weldless battery pack as a power source, comprising:
    a radio;
    a battery pack housing able to couple to said radio;
    a flexible circuit inserted into said housing;
    at least one spring contact integrally formed on the flexible circuit; and
    a plurality of cells within said housing so that at least two cells include a first end and a second end wherein the first end of one cell is connected to the second end of an adjacent cell by a spring means for reducing intermittency between said cells and said flexible circuit.

11. The radio assembly of claim 10, wherein said spring means comprises a popple contact having a flat portion coupled to the negative terminal of a cell and a domed portion coupled to the positive terminal of an adjacent cell.

12. The radio assembly of claim 10, wherein said spring means comprises a disc-shaped wedge spring having a cantilever member protruding from the base for placement between at least some of said plurality of cells.

13. The radio assembly of claim 10, wherein said at least one spring contact integrally formed on the flexible circuit is soldered to the flexible circuit.

* * * * *